(12) United States Patent
Lin (10) Patent No.: US 6,255,129 B1
(45) Date of Patent: Jul. 3, 2001

(54) LIGHT-EMITTING DIODE DEVICE AND METHOD OF MANUFACTURING THE SAME

(75) Inventor: Ming-Der Lin, Hsin Chu (TW)

(73) Assignee: Highlink Technology Corporation, Hsin Chu (TW)

( * ) Notice: Subject to any disclaimer, the term of this patent is extended or adjusted under 35 U.S.C. 154(b) by 0 days.

(21) Appl. No.: 09/658,347

(22) Filed: Sep. 7, 2000

(51) Int. Cl.$^7$ .................................................... H01L 21/00
(52) U.S. Cl. ................ 438/26; 438/29; 438/46; 438/111; 257/99; 257/100
(58) Field of Search .................. 438/25, 26, 46, 438/29, 111, 123; 257/81, 99, 100

(56) References Cited

U.S. PATENT DOCUMENTS

| | | | |
|---|---|---|---|
| 5,358,880 | * 10/1994 | Lebby et al. | 438/26 |
| 5,369,289 | * 11/1994 | Tamaki et al. | 257/99 |
| 5,977,565 | * 11/1999 | Ishikawa et al. | 257/81 |
| 5,999,151 | * 12/1999 | Michael | 345/83 |
| 6,069,440 | * 5/2000 | Shimizu et al. | 313/486 |
| 6,084,252 | * 7/2000 | Isokawa et al. | 257/98 |
| 6,091,084 | * 7/2000 | Fujii | 438/26 |
| 6,103,541 | * 8/2000 | Yang et al. | 438/26 |

* cited by examiner

Primary Examiner—Kevin M. Picardat
(74) Attorney, Agent, or Firm—Martine & Penilla, LLP (57) ABSTRACT

A light-emitting diode device, such as a blue, green, blue-green light-emitting diode, with a one-wire-bonding characteristic and the method of manufacturing the same have been disclosed. The light-emitting diode device has a GaN-based semiconductor laminated structure formed on an insulating substrate. The GaN-based semiconductor laminated structure includes an n-type layer on its bottom side, a p-type layer on its top side, and an active layer, for generating light, sandwiched between the n-type and p-type layers. An annular isolation portion such as a trench or a high resistivity portion formed by ion implantation is formed in the GaN-based semiconductor laminated structure to separate the p-type layer into a central p-type layer and a peripheral p-type layer and to separate the active layer into a central active layer and a peripheral active layer. A p-type electrode is formed on the central p-type layer without electrically connecting to the peripheral p-type layer. A conductive layer is coated to cover the sidewalls and the bottom surface of the insulating substrate and to ohmically contact with the n-type layer. Preferably, an adhesion layer is sandwiched between the sidewalls and the bottom surface of the insulating substrate and the conductive layer to enhance the adhesive property. According to the present invention, the conductive layer may be formed as a mirror-like reflector or a light-transmissive layer.

20 Claims, 12 Drawing Sheets

LIGHT-EMITTING DIODE DEVICE AND METHOD OF MANUFACTURING THE SAME

BACKGROUND OF THE INVENTION

A. Field of the Invention

The present invention relates to a light-emitting diode (LED) device and the method of manufacturing the same. More particularly, the present invention relates to an LED device, made of GaN-based compound semiconductor materials, whose sidewalls and bottom surface are both covered with a conductive layer, and the method of manufacturing the same.

B. Description of the Related Art

In recent years, the GaN-based compound semiconductor has received more and more attention to use of a material for manufacturing blue, green, blue-green light-emitting devices, such as blue LEDs or blue laser diodes (LDs). The blue LED, for example, generally has a structure including at least one n-type GaN-based compound semiconductor layer, an active layer made of an intrinsic or doped GaN-based compound semiconductor material, and at least one p-type GaN-based compound semiconductor layer, which are sequentially laminated on a substrate.

In manufacturing the conventional blue LED, transparent sapphire is usually used as a material of the substrate of the blue LED. Different from the semiconductor substrate used for other semiconductor light-emitting devices, sapphire is an electrically insulating material. Consequently, it is impossible to directly form the n-type electrode on the sapphire substrate. As a solution to this problem, the n-type GaN-based compound semiconductor layer is partially exposed by means of etching the blue LED so as to provide a conductive surface where an n-type electrode is effectively to be formed.

Figure 1:
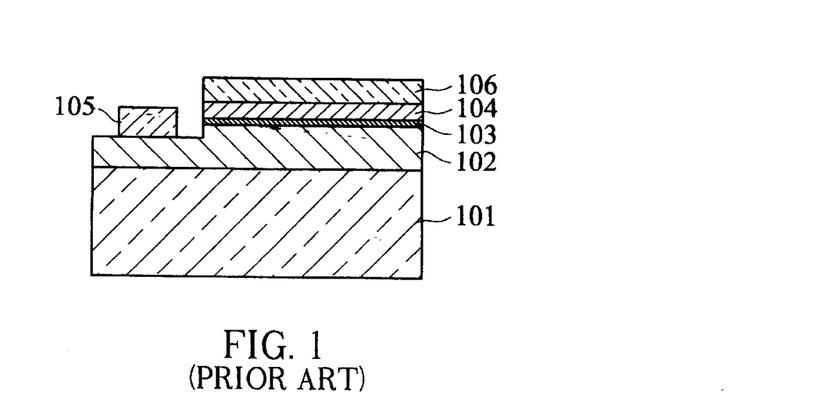
FIG. 1 is a cross-sectional view showing a conventional blue LED.

Referring to FIG. 1 for a more specific understanding of the conventional blue LED described above, the conventional blue LED mainly includes a sapphire substrate 101, an n-type GaN-based compound semiconductor layer 102, an active layer 103 made of an intrinsic or doped GaN-based compound semiconductor material, and a p-type GaN-based compound semiconductor layer 104. As described above, an n-type electrode 105 is formed on the exposed surface of the n-type GaN-based compound semiconductor layer 102, while a p-type electrode 106 is formed on the p-type GaN-based compound semiconductor layer 104.

Figure 2:
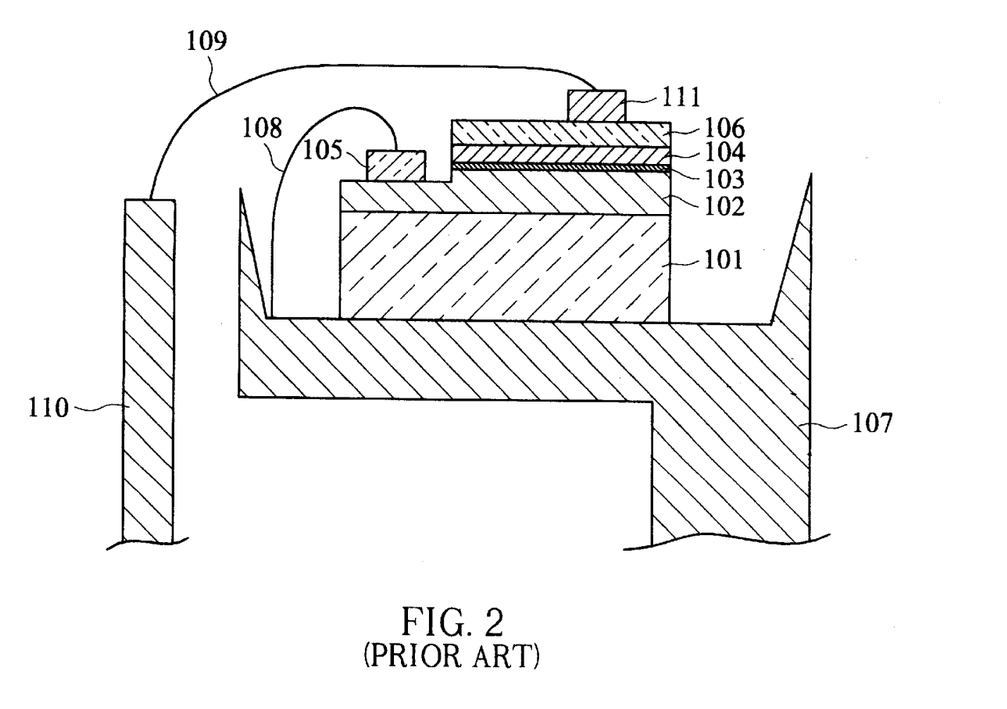
FIG. 2 is a cross-sectional view showing the conventional blue LED of FIG. 1, which is mounted on a cup-type lead frame.

The conventional blue LED shown in FIG. 1, however, has several disadvantages as described in the following. First of all, the insulating sapphire substrate 101 of the blue LED fails to form an electrical connection with a cup-type lead frame 107 when mounted on the surface of the cup-type lead frame 107. In order to electrically connect the blue LED with the cup-type lead frame 107, it is necessary to use a metal bonding wire 108 for electrically bonding the n-type electrode 105 to the surface of the cup-type lead frame 107, as shown in FIG. 2. Since another metal bonding wire 109 needs to electrically bond the p-type electrode 106. to a separate lead frame 110, the wire bonding process must be performed twice for completely bonding the conventional blue LED. In addition, the metal bonding wire 109 is bonded on the p-type electrode 106 preferably through a bonding pad 111. As a result of the two-wire-bonding characteristic, the complication of the conventional process of manufacturing the blue LED and the die size of the blue LED are both greatly increased, which result in a high fabrication cost.

Figure 3:
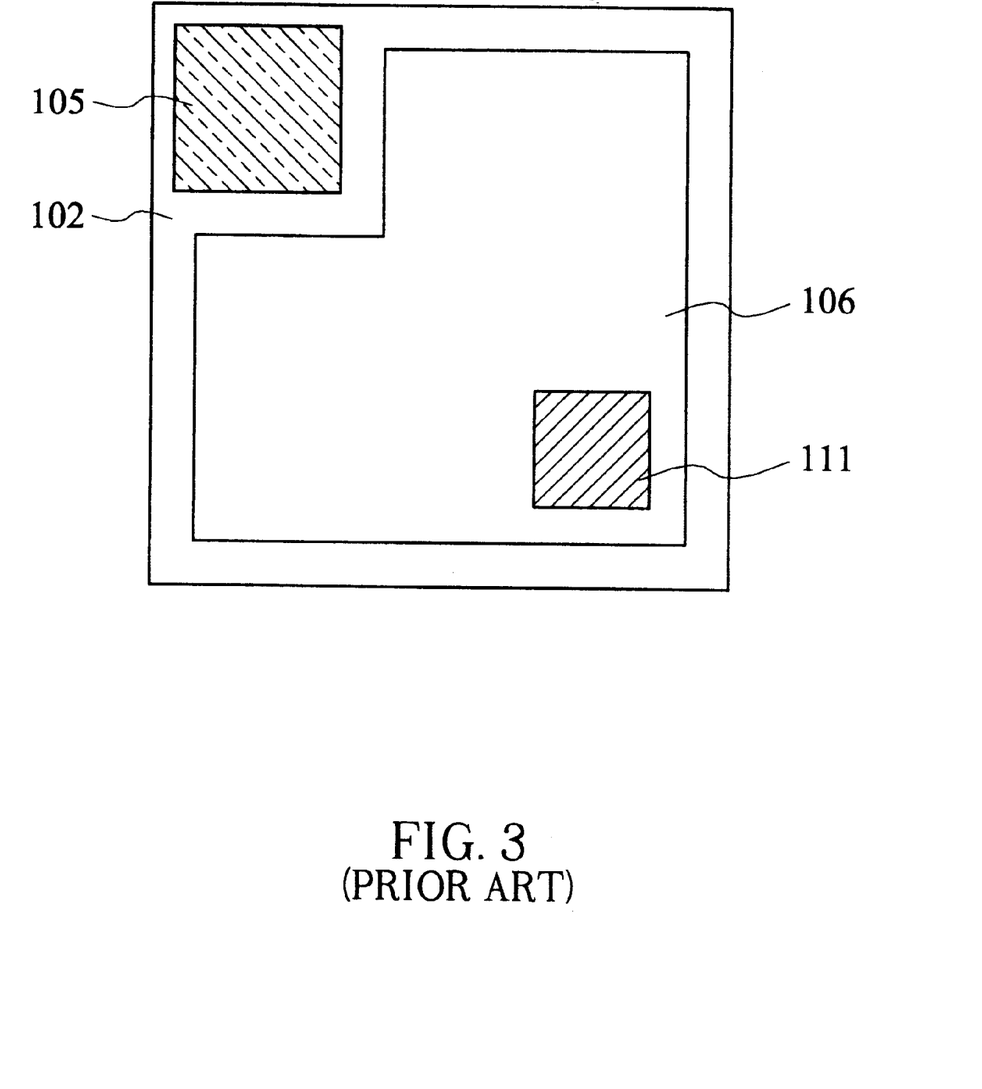
FIG. 3 is a top view showing the arrangement of the electrodes of the conventional blue LED of FIG. 1.

Moreover, the structure and arrangement of the electrodes 105, 106 of the conventional blue LED is asymmetric as shown in FIG. 3, which is the top view of the blue LED shown in FIG. 1. As a result, the electric current in the conventional blue LED does not flow in a symmetric and top-down direction. Therefore, it is very difficult for the conventional blue LED to achieve a uniform A current spreading characteristic. Since the current spreading characteristic is non-uniform, several high current density points exist in the conventional blue LED, which are easily damaged during the operation.

Furthermore, the well-known electrostatic discharge (ESD) problem inevitably occurs in the insulating sapphire substrate 101. The above-mentioned disadvantages greatly reduce the performance and reliability of the conventional blue LED.

Accordingly, it is desirable to provide a blue LED that achieves a one-wire-bonding characteristic without greatly increasing the complication of the manufacturing process and the fabrication cost. It is also desirable to provide a blue LED that achieves a uniform current spreading characteristic and is free from the ESD problem. Furthermore, it is desirable to provide a blue LED provided with a mirror-like reflector formed on its bottom surface, thereby increasing the light-emitting efficiency of the blue LED.

SUMMARY OF THE INVENTION

An object of the present invention is to provide a light-emitting diode device which achieves a one-wire-bonding characteristic. The complication of the manufacturing process is thus simplified and the fabrication cost is reduced.

Another object of the present invention is to provide a light-emitting diode device with a uniform current spreading characteristic.

Still another object of the present invention is to provide a light-emitting diode device which is free from the electrostatic discharge (ESD) problem.

Yet still another object of the present invention is to provide a light-emitting diode device with a mirror-like reflector formed on the bottom surface.

According to a first aspect of the present invention, a light-emitting diode device comprises: an insulating substrate; a laminated semiconductor structure having a first GaN-based semiconductor layer formed on the top surface of the insulating substrate; an active layer formed over the first GaN-based semiconductor layer for generating light; and a second GaN-based semiconductor layer formed over the active layer, wherein an annular trench is formed to separate the second GaN-based semiconductor layer into a central second GaN-based semiconductor layer and a peripheral second GaN-based semiconductor layer and to separate the active layer into a central active layer and a peripheral active layer; a first electrode formed on the central second GaN-based semiconductor layer without electrically connecting to the peripheral second GaN-based semiconductor layer; and a conductive layer coated to cover the sidewalls and the bottom surface of the insulating substrate and to ohmically contact with the first GaN-based semiconductor layer.

The method of manufacturing the light-emitting diode device according to the first aspect of the present invention comprises: preparing an insulating substrate; forming a first GaN-based semiconductor layer on the insulating substrate; forming an active layer over the first GaN-based semiconductor layer for generating light; forming a second GaN-based semiconductor layer over the active layer; forming an annular trench to separate the second GaN-based semiconductor layer into a central second GaN-based semiconductor layer and a peripheral second GaN-based semiconductor layer and to separate the active layer into a central active layer and a peripheral active layer; forming a first electrode on the central second GaN-based semiconductor layer without electrically connecting to the peripheral second GaN-based semiconductor layer; and coating a conductive layer to cover the sidewalls and the bottom surface of the insulating substrate and to ohmically contact with the first GaN-based semiconductor layer.

According to a second aspect of the present invention, an adhesion layer is formed on the sidewalls and the bottom surface of the insulating substrate, which is followed by forming the conductive layer over the adhesion layer. The adhesion layer is used to enhance the adhesive property between the insulating substrate and the conductive layer.

According to a third aspect of the present invention, the conductive layer is a light-transmissive layer. As the light-transmissive conductive layer, an indium-tin-oxide layer, a cadmium-tin-oxide layer, a zinc oxide layer, or a thin metal layer, with a thickness in the range from 0.001 $\mu$m to 1 $\mu$m, made of Au, Ni, Pt, Al, Sn, In, Cr, Ti, or their alloy, may be used.

According to a fourth aspect of the present invention, an annular portion with a high resistivity is formed by means of ion implantation to replace the annular trench used in the first aspect of the present invention. The annular portion with a high resistivity formed by means of ion implantation provides the electrical isolation necessary for the present invention.

BRIEF DESCRIPTION OF THE DRAWINGS

These and other objects, features, and advantages of the present invention will become apparent with reference to the following descriptions and accompanying drawings, wherein.

DETAIL DESCRIPTION OF THE PREFERRED EMBODIMENTS

The preferred embodiments according to the present invention will be described in detail with reference to the drawings.

[First Embodiment]

FIGS. 4(a) to 4(e) are cross-sectional views showing the steps of manufacturing a blue LED 400 according to a first embodiment of the present invention.

Figure 4A:
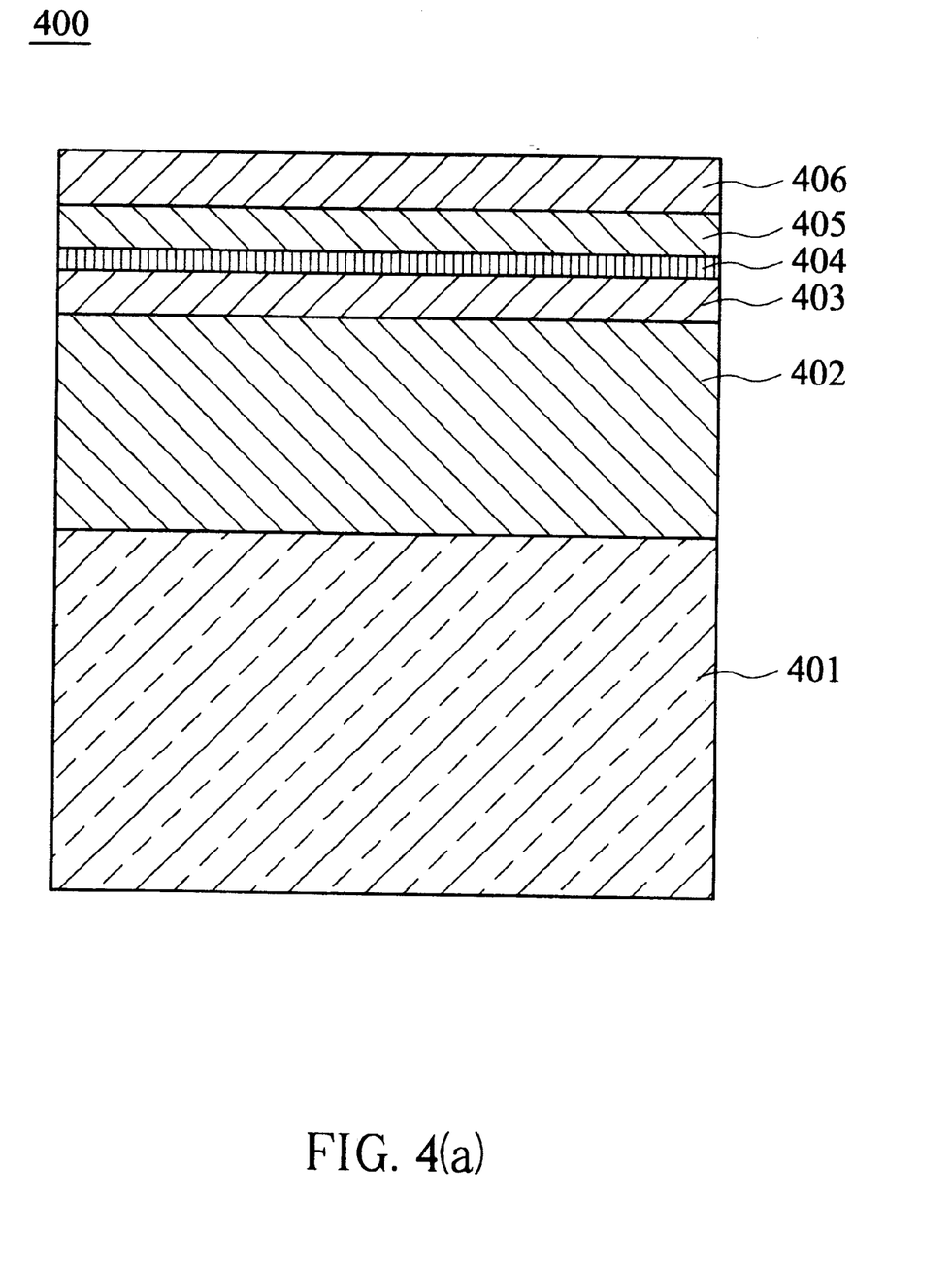
FIGS. 4(a) to 4(e) are cross-sectional views showing the steps of manufacturing a blue LED according to a first embodiment of the present invention.

Referring to FIG. 4(a), an n-type layer 402 with a thickness of 3 $\mu$m to 5 $\mu$m is first formed on an insulating substrate 401. The insulating substrate 401 is usually made of sapphire. On the n-type layer 402, an n-type confining layer 403 with a thickness 0.1 $\mu$m to 0.3 $\mu$m, an active layer 404 with a thickness of 500 Å to 2000 Å for emitting the light, a p-type confining layer 405 with a thickness of 0.1 $\mu$m to 0.3 $\mu$m, and a p-type layer 406 with a thickness of 0.2 $\mu$m to 1 $\mu$m are sequentially formed. Each of these layers 402 to 406 is made of a GaN-based compound semiconductor material. For example, a quaternary compound semiconductor material of $In_xAl_yGa_{1-x-y}N$ can be adopted to form the layers 402 to 406 with different conductivity types and concentrations of dopants, wherein the mole fractions x, y satisfy $0 \leq x < 1$, $0 \leq y < 1$ and $x+y=1$. It should be noted that the structure of the blue LED 400 according to the present invention can be in any desirable form, i.e. the practical structure of the blue LED 400 is not limited to that described in the first embodiment.

Figure 4B:
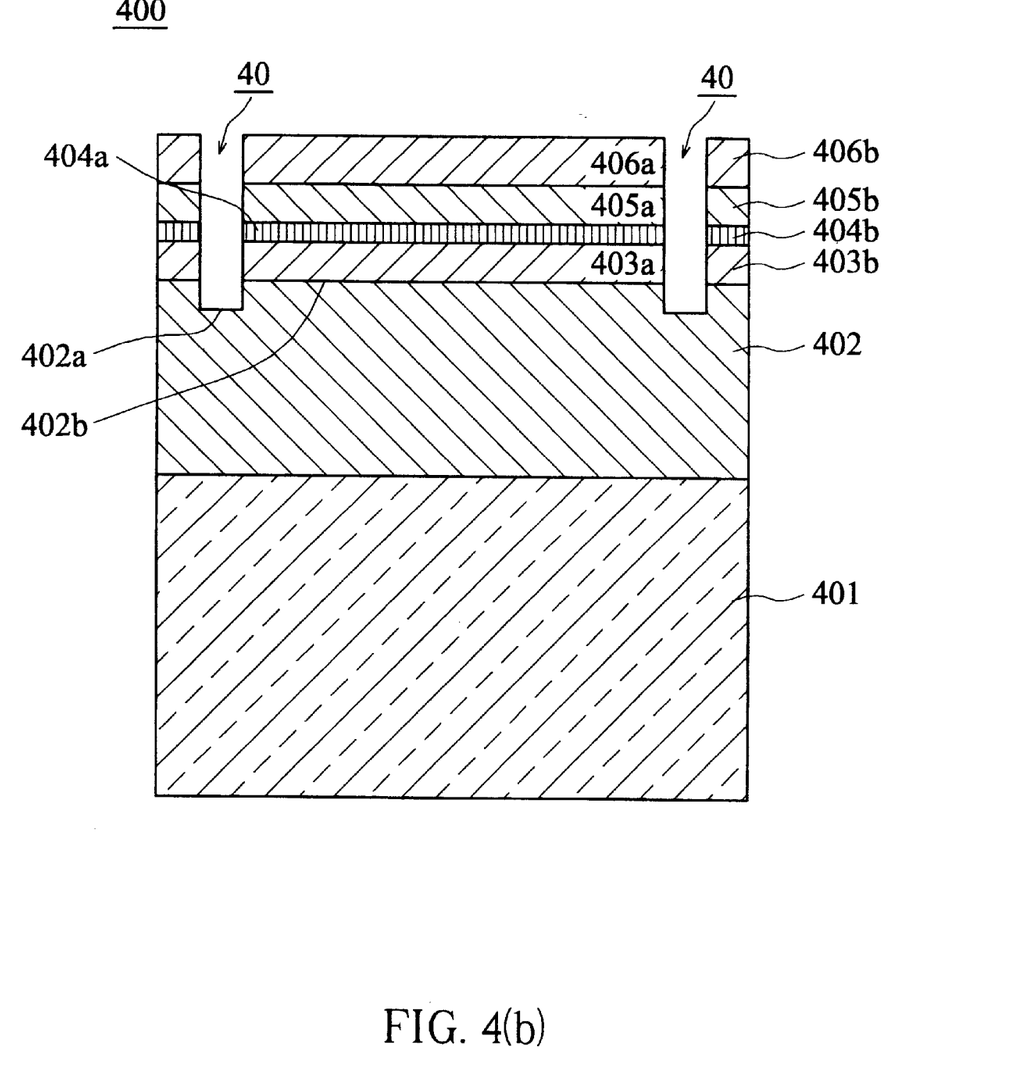

Referring to FIG. 4(b), an annular trench 40 is formed in the blue LED 400 by conventional photolithography and etching. Through precise control of the etching time, the depth of the annular trench 40 is deep enough to separate the p-type layer 406 into a central p-type layer 406a and a peripheral p-type layer 406b, to separate the p-type confining layer 405 into a central p-type confining layer 405a and a peripheral confining layer 405b, to separate the active layer 404 into a central active layer 404a and a peripheral active layer 404b, to separate the n-type confining layer 403 into a central n-type confining layer 403a and a peripheral n-type confining layer 403b, and to expose the n-type layer 402. Preferably, the n-type layer 402 is slightly etched so that the exposed surface 402a of the n-type layer 402 is lower than the covered surface 402b of the n-type layer 402, i.e. the interface between the n-type layer 402 and the central n-type confining layer 403a. In this embodiment, the preferable etching process is a dry etching process.

Figure 4C:
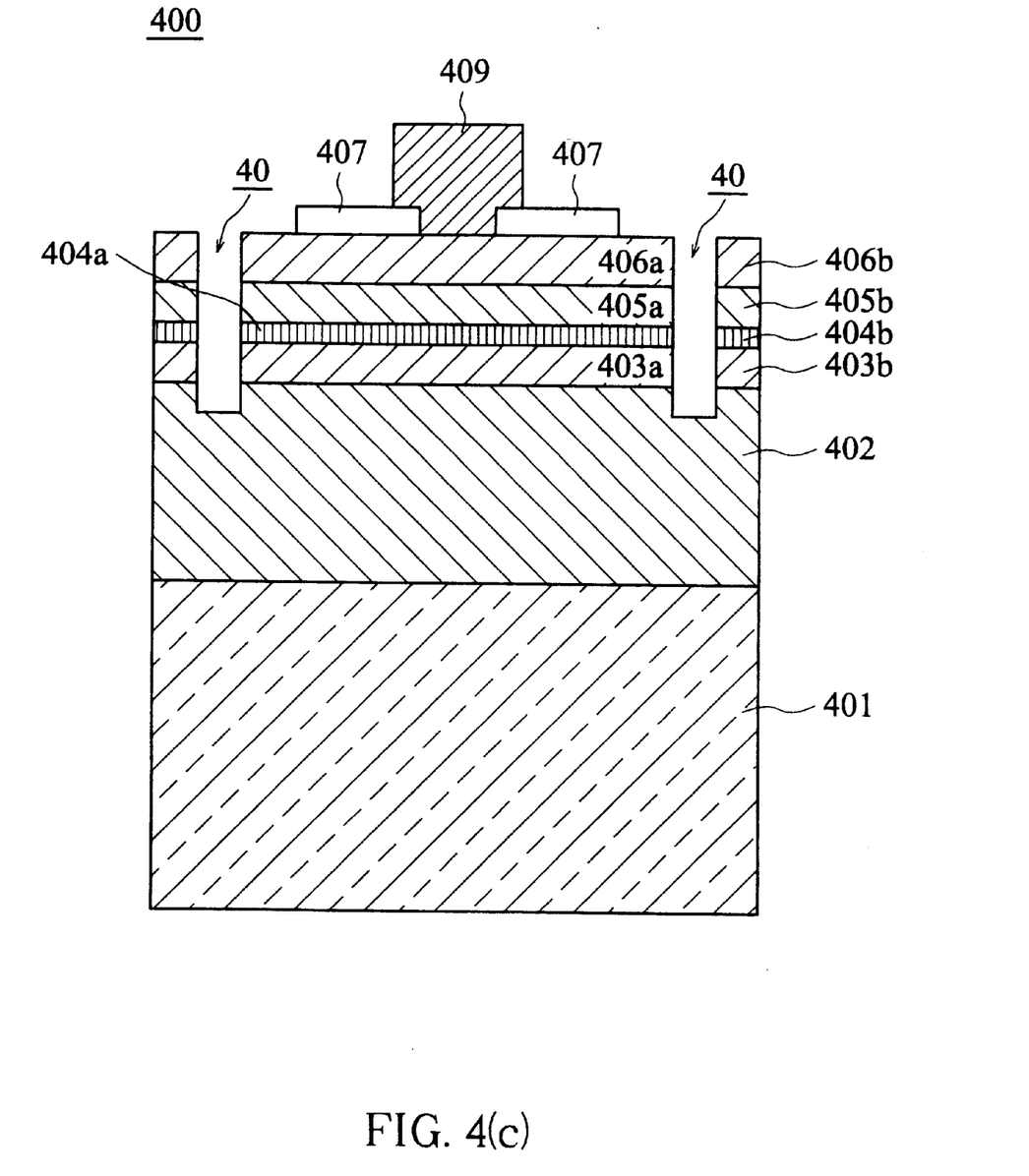

Referring to FIG. 4(c), a p-type electrode 409 is formed on the surface of the central p-type layer 406a. The p-type electrode 409 may be made of any metals whose ability to form a p-type ohmic contact with the p-type GaN-based compound semiconductor material. For example, the p-type electrode 409 is made of Ni, Ti, Al, Au, or their alloy in this embodiment. During the formation of the p-type electrode 409, a transparent contact layer (TCL) 407 with a thickness of 50 Å to 250 Å is preferably inserted between the central p-type layer 406a and the p-type electrode 409 to substantially cover the entire surface of the central p-type layer 406a, thereby simultaneously increasing the light-emitting efficiency and current spreading uniformity of the blue LED 400. The TCL 407 is a light-transmissive, ohmic contact layer made of a conductive material, such as Au, Ni, Pt, Al, Sn, In, Cr, Ti, or their alloy.

Figure 4D:
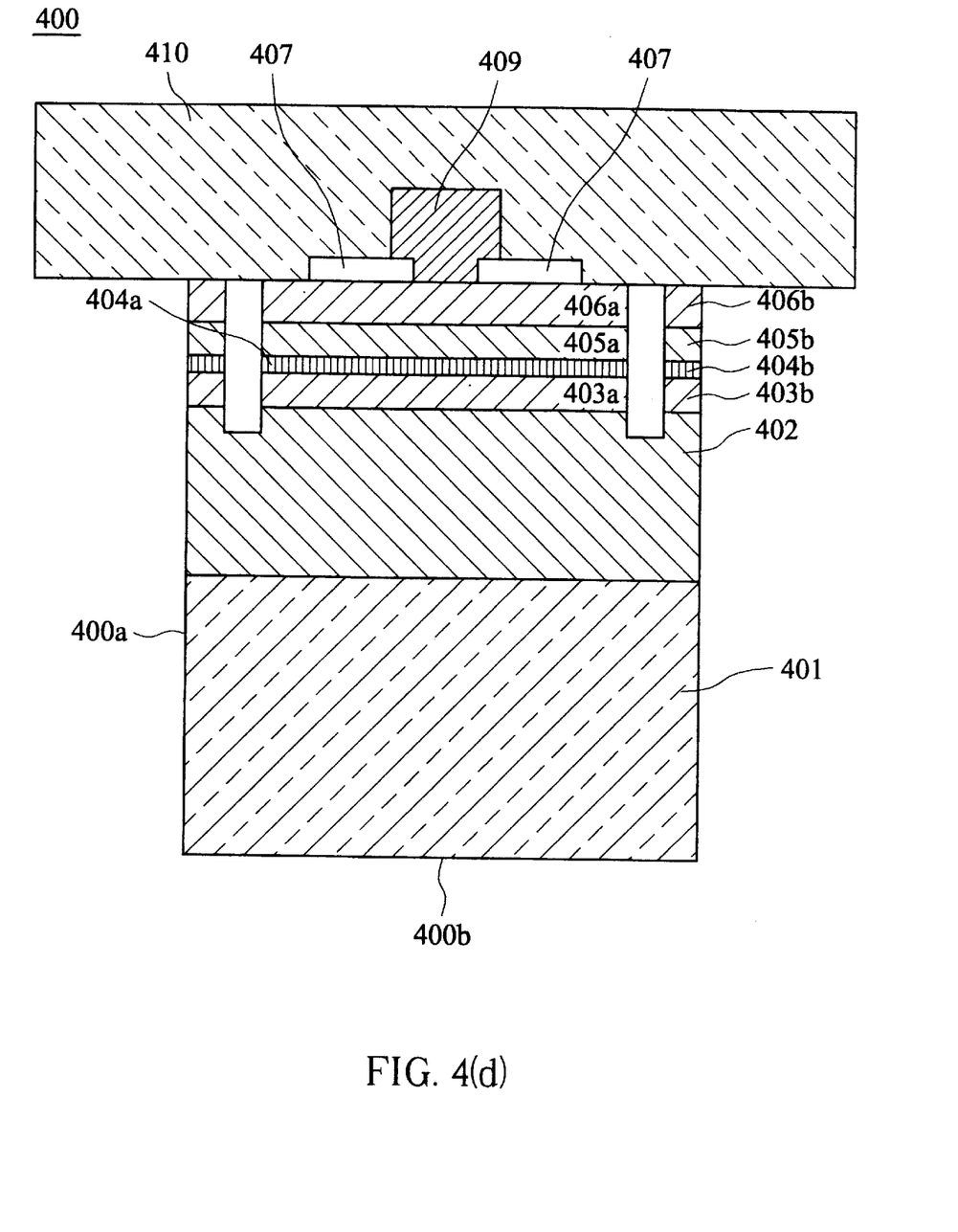

Referring to FIG. 4(d), an elastic tape 410 made of polyvinyl chloride (PVC) is then disposed onto the blue LED 400 so as to cover the top side of the blue LED 400. As a result, only the sidewalls 400a and the bottom surface 400b of the blue LED 400 are exposed.

Figure 4E:
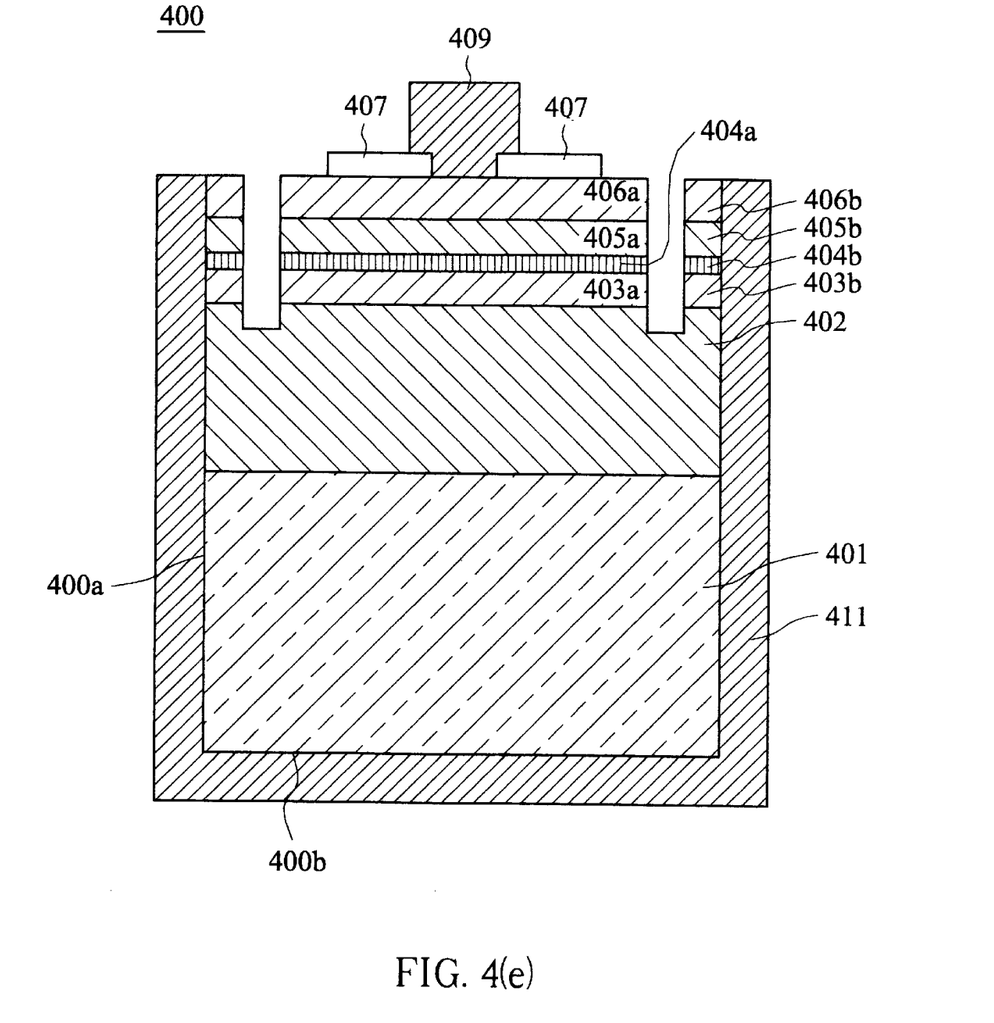

Referring to FIG. 4(e), a conductive layer 411 is then coated to directly cover the sidewalls 400a and the bottom surface 400b of the blue LED 400 so as to provide an n-type electrode. At this time, the top side of the blue LED 400 is protected from contacting the conductive layer 411 by means of the elastic tape 410. As to the material of the conductive layer 411, any metals whose ability to form an n-type ohmic contact with the n-type layer 402 may be used. For example, the conductive layer 411 is made of Au, Al, Ti, Cr, or their alloy in this embodiment. The elastic tape 410 is removed to expose the top side of the blue LED 400 after the formation of the conductive layer 411. Since the conductive layer 411 electrically connects with the n-type layer 402 at the sidewalls thereof, the conductive layer 411 is effectively used as an n-type electrode. Therefore the blue LED 400 of the first embodiment according to the present invention is achieved.

Figure 5:
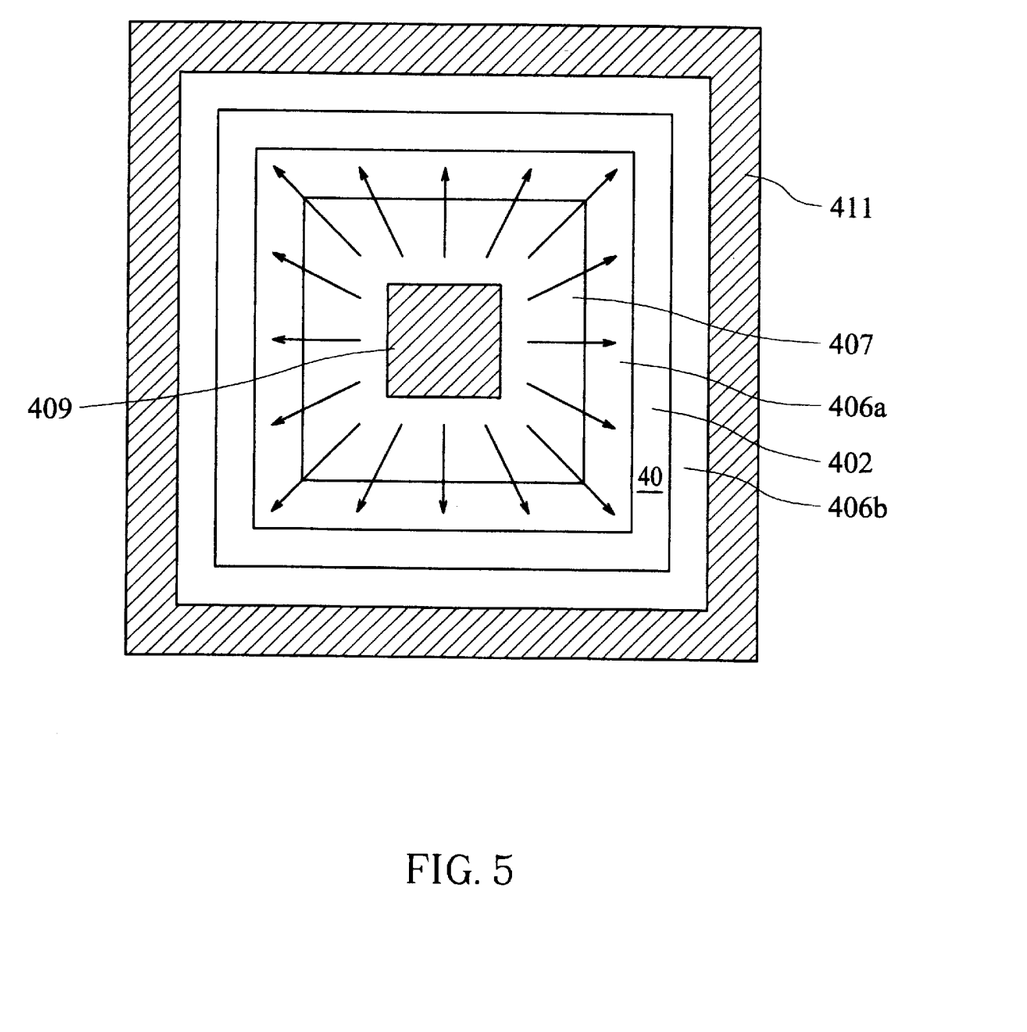
FIG. 5 is a top view showing the arrangement of the electrodes of the blue LED of FIG. 4(e)

FIG. 5 is a top view of the blue LED 400 shown in FIG. 4(e) according to the first embodiment of the present invention. Apparently, the structure and arrangement of the p-type electrode 409 and the conductive layer 411, served as the n-type electrode, of the blue LED 400 are both symmetric. As a result, the electric current in the blue LED 400 flows along a top-down direction from the p-type electrode 409 to the conductive layer 411 and uniformly spreads out in an outwardly radial direction, as indicated by arrows of FIG. 5. Therefore, it is very effective for the blue LED 400 according to the present invention to achieve the uniform current spreading characteristic. Since the current spreading characteristic is uniform, there are no high current density points existed in the blue LED 400. The reliability and lifetime of the blue LED 400 are greatly enhanced. It should be noted that the shapes of the p-type electrode 409 and the conductive layer 411 are not limited to the particular forms shown in FIG. 5, and may be in any desirable forms.

Figure 6:
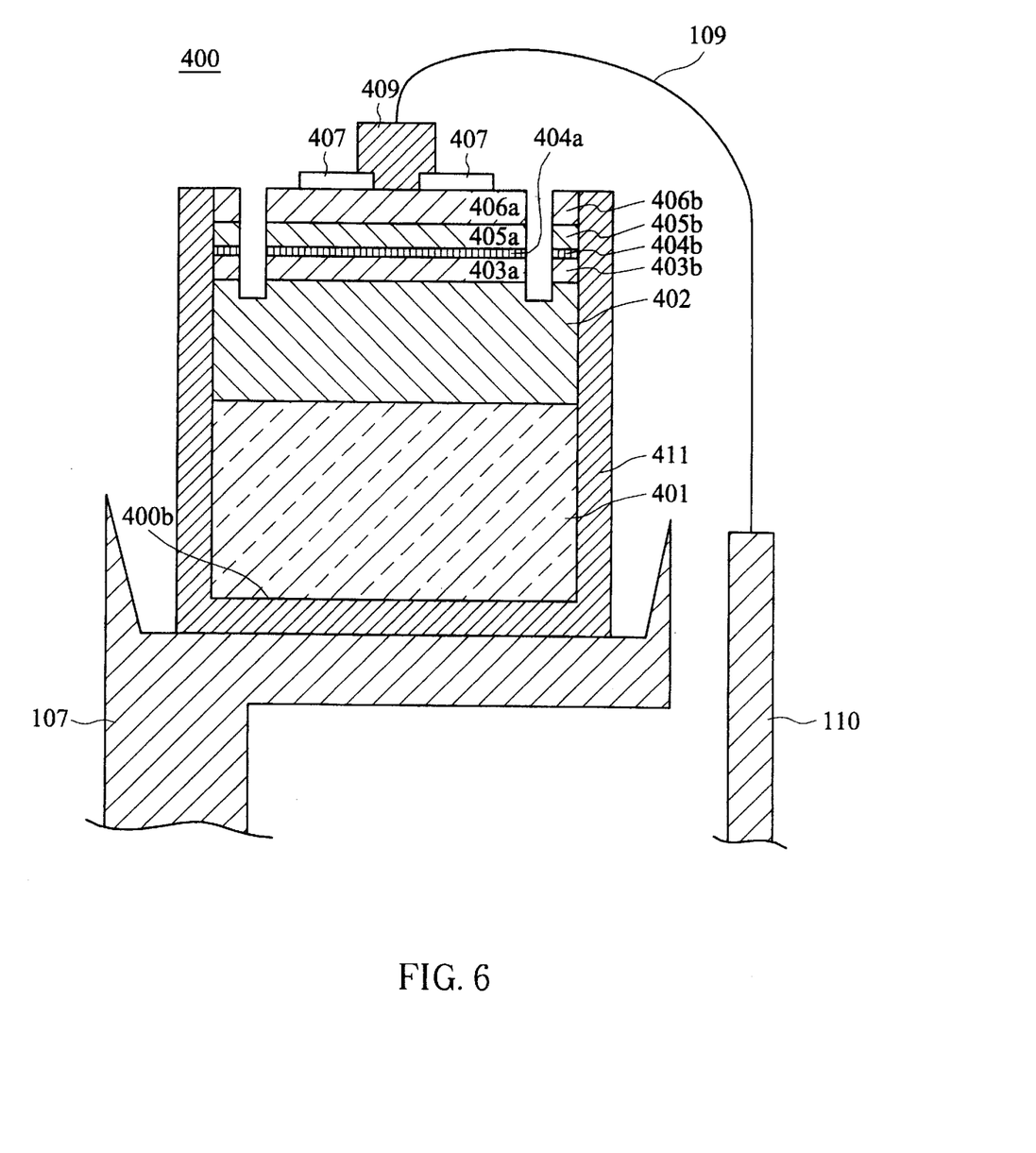
FIG. 6 is a cross-sectional view showing the blue LED of FIG. 4(e), which is mounted on a cup-type lead frame.

FIG. 6 is a cross-sectional view showing a manner for bonding the blue LED 400 according to the first embodiment of the present invention on the cup-type lead frame 107 and the separate lead frame 110. Because the conductive layer 411 ohmically contacts with the n-type layer 402 and covers the bottom surface 400b of the blue LED 400, the n-type layer 402 is electrically connected to the surface of the cup-type lead frame 107 via the conductive layer 411 when the blue LED 400 is mounted onto the cup-type lead frame 107. In other words, it is not necessary for electrically connecting the n-type layer 402 with the cup-type lead frame 107 to use any bonding wires. As a result, only the electrical connection between the p-type electrode 409 and the separate lead frame 110 needs use of a bonding wire 109. Consequently, the blue LED 400 according to the present invention achieves a one-wire-bonding characteristic, thereby simplifying the complication of the process and reducing the fabrication cost.

Furthermore, the conductive layer 411 covering the sidewalls 400a and the bottom surface 400b of the blue LED 400 does not only provide an ESD protection path, but also acts as a mirror-like reflector which reflects back the light emitting from the central active layer 404a to thereby increase the light-emitting efficiency of the blue LED 400.

[Second Embodiment]

Figure 7:
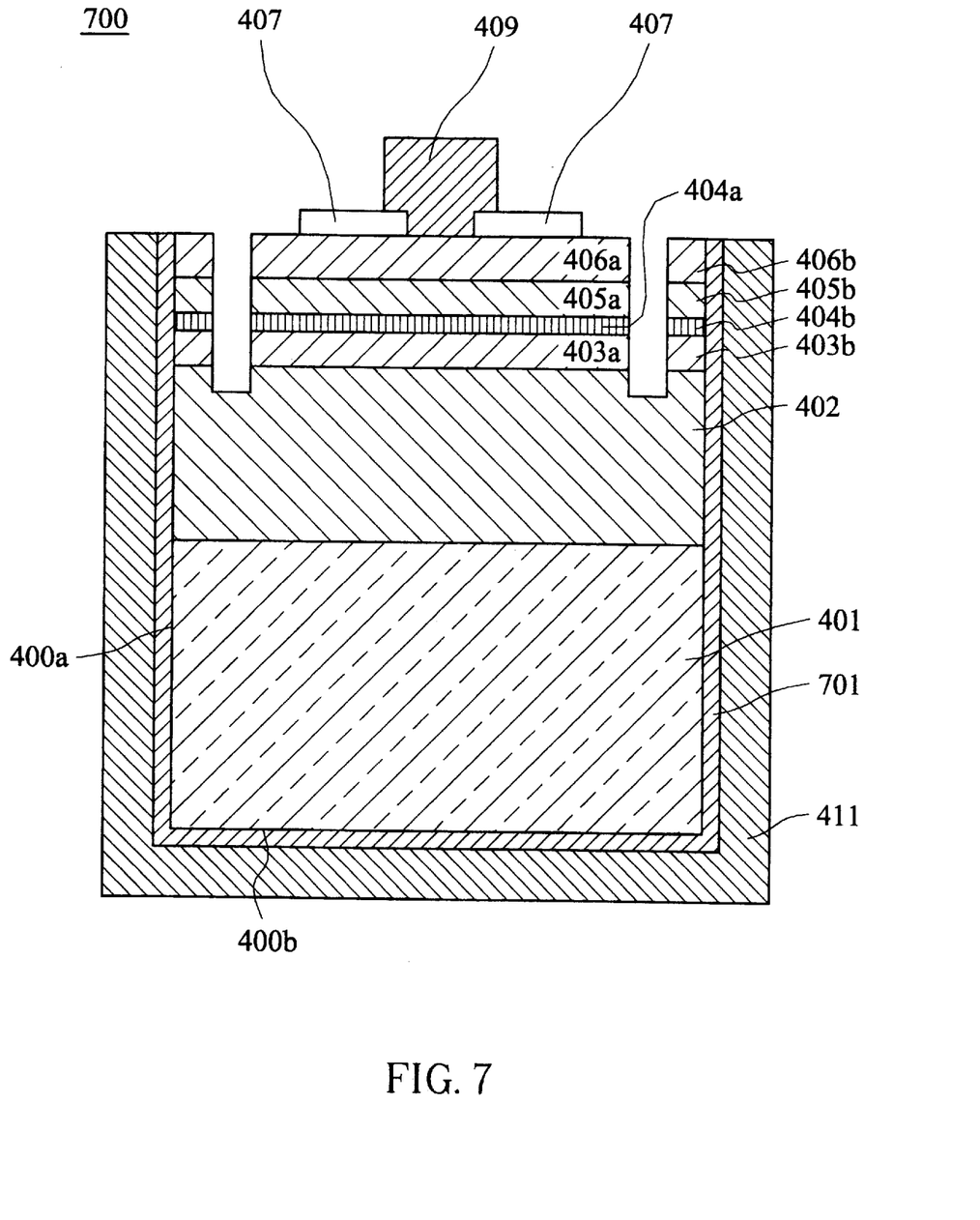
FIG. 7 is a cross-sectional view showing a blue LED according to a second embodiment of the present invention.

FIG. 7 is a cross-sectional view showing a blue LED 700 according to a second embodiment of the present invention. In FIG. 7, the elements of the blue LED 700 similar to that of the blue LED 400 shown in FIGS. 4(a) to 4(e) are referred to as the similar reference numerals. For the sake of simplification, only the difference of the second embodiment from the first embodiment is described hereinafter.

During manufacturing of the blue LED 700, all steps are the same as that of manufacturing the blue LED 400 shown in FIGS. 4(a) to 4(e) except for an adhesion layer 701 is formed to cover the sidewalls 400a and the bottom surface 400b of the LED structure 700 before the formation of the conductive layer 411. The adhesion layer 701 is used to enhance the adhesive property between the sidewalls and bottom surface of the insulating substrate 401 and the conductive layer 411. The material of the adhesion layer 701 may be Ti, Ni, Al, Cr, Pd, or any metal which can enhance the adhesive property between the sidewalls and bottom surface of the insulating substrate 401 and the conductive layer 411.

[Third Embodiment]

Figure 8:
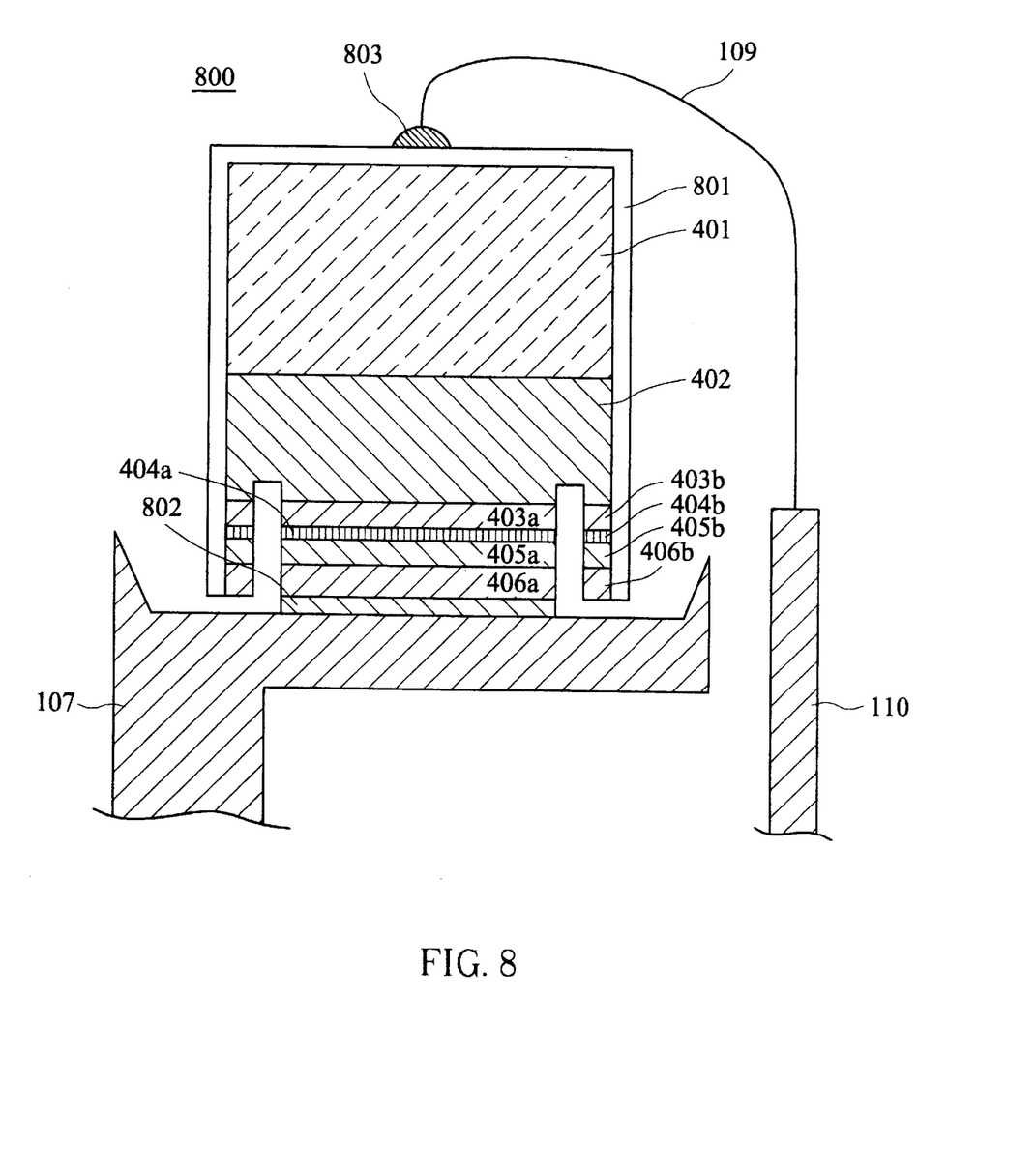
FIG. 8 is a cross-sectional view showing a blue LED according to a third embodiment of the present invention, which is mounted on a cup-type lead frame.

FIG. 8 is a cross-sectional view showing a blue LED 800 according to a third embodiment of the present invention. In FIG. 8, the elements of the blue LED 800 similar to that of the blue LED 400 shown in FIGS. 4(a) to 4(e) are referred to as the similar reference numerals. For the sake of simplification, only the difference of the third embodiment from the first or second embodiment is described hereinafter.

As described in the first and second embodiment, the light generated in the central active layer 404a is then emitted out of the blue LED 400 through the top side, i.e. the central p-type layer 406a, of the blue LED 400. However, the third embodiment provides a blue LED 800 which emits out the light generated in the central active layer 404a through the bottom side, i.e. the insulating substrate 401, of the blue LED 800.

In order to achieve the blue LED 800 of the third embodiment, the conductive layer 801 is formed as a light-transmissive layer to allow the transmission of the light generated in the central active layer 404a. As the light-transmissive conductive layer 801, an indium-tin-oxide (ITO) layer, a cadmium-tin-oxide (CTO) layer, a zinc oxide (ZnO) layer, or a thin metal layer, with a thickness in the range from 0.001 $\mu$m to 1 $\mu$m, made of Au, Ni, Pt, Al, Sn, In, Cr, Ti, or their alloy, may be used.

Furthermore, the p-type electrode 802 is formed to substantially cover the entire surface of the central p-type layer 406a. In the third embodiment, the p-type electrode 802 is used as a mirror-like reflector to reflect back the light generated in the central active layer 404a, thereby increasing the light-emitting efficiency of the blue LED 800.

When mounted onto the cup-type lead frame 107, the blue LED 800 of the third embodiment is turned facedown to electrically connect the p-type electrode 802 with the surface of the cup-type lead frame 107, as shown in FIG. 8. Next, the light-transmissive conductive layer 801 is electrically connected to the separate lead frame 110 via a bonding wire 109. To enhance the bonding strength between the light-transmissive conductive layer 801 and the bonding wire 109, a bonding pad 803 is preferably used.

Similar to the first and second embodiment; only a bonding wire 109 is necessary for the blue LED 800 of the third embodiment despite of the different mounting orientation. Consequently, the blue LED 800 also achieves the one-wire-bonding characteristic, thereby simplifying the complication of the process and reducing the fabrication cost. Furthermore, the light-transmissive conductive layer 801 covering the sidewalls and the bottom surface of the insulating substrate 401 of the blue LED 800 provides an ESD protection path.

[Fourth Embodiment]

Figure 9:
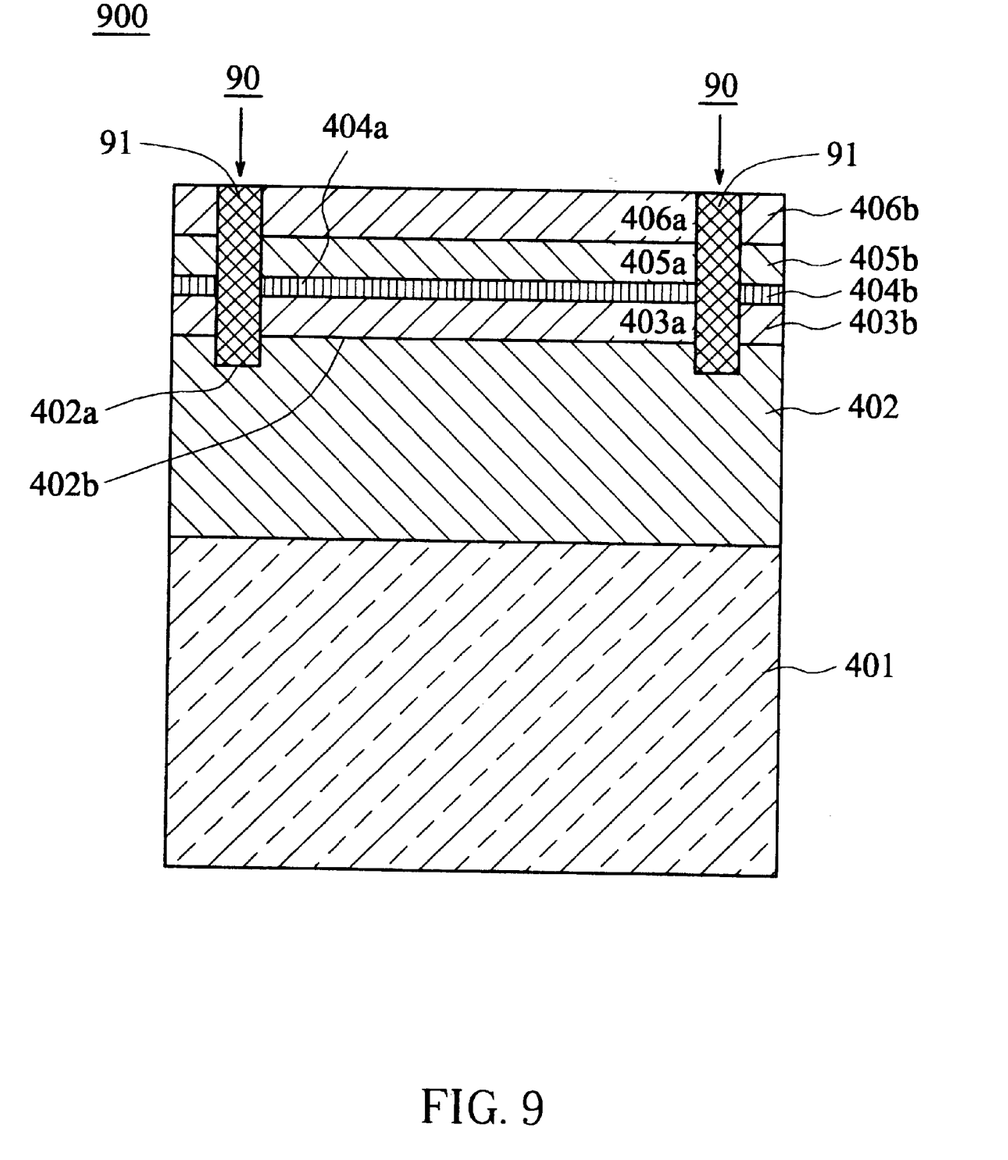
FIG. 9 is a cross-sectional view showing a blue LED according to a fourth embodiment of the present invention.

FIG. 9 is a cross-sectional view showing a blue LED 900 according to a fourth embodiment of the present invention. In FIG. 9, the elements of the blue LED 900 similar to that of the blue LED 400 shown in FIG. 4(b) are referred to as the similar reference numerals. For the sake of simplification, only the difference of the fourth embodiment from the first embodiment is described hereinafter.

In the first embodiment shown in FIG. 4(b), the annular trench 40 is formed to separate the central p-type layer 406a and the peripheral p-type layer 406b, to separate the central p-type confining layer 405a and the peripheral confining layer 405b, to separate the central active layer 404a and the peripheral active layer 404b, and to separate the central n-type confining layer 403a and the peripheral n-type confining layer 403b. The separation provided by the annular trench 40 is in practice a kind of electrical isolation since the annular trench 40 can be considered as an annular air gap, which has a very high resistivity. In this regard, any high resistivity elements which provide the necessary electrical isolation can be used to replace the annular trench 40 and effectively achieve the present invention.

The fourth embodiment is one example for effectively forming the electrical isolation. Referring to FIG. 9, an ion implantation 90 is performed at an annular region of the blue LED 900 to form an annular ion implantation portion 91. The depth of the annular ion implantation portion 91 is set to extend to the n-type layer 402 through precise control of ion energies. Since the ions implanted into the annular ion implantation portion 91 destroy its crystalline structure, thereby greatly increasing the electrical resistivity, the annular ion implantation portion 91 effectively provides a high resistivity isolation for the central p-type layer 406a and the peripheral p-type layer 406b, the central p-type confining layer 405a and the peripheral confining layer 405b, the central active layer 404a and the peripheral active layer 404b, and the central n-type confining layer 403a and the peripheral n-type confining layer 403b, respectively.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing a light-emitting diode device, comprising the steps of:

preparing an insulating substrate;

forming a first GaN-based semiconductor layer on said insulating substrate;

forming an active layer over said first GaN-based semiconductor layer for generating light;

forming a second GaN-based semiconductor layer over said active layer;

forming an annular isolation portion to separate said second GaN-based semiconductor layer into a central second GaN-based semiconductor layer and a peripheral second GaN-based semiconductor layer and to separate said active layer into a central active layer and a peripheral active layer;

forming a first electrode on said central second GaN-based semiconductor layer without electrically connecting to said peripheral second GaN-based semiconductor layer; and coating a conductive layer to cover the sidewalls and the bottom surface of said insulating substrate and to ohmically contact with said first GaN-based semiconductor layer.

2. The method of manufacturing a light-emitting diode device according to claim 1, wherein said step of forming said annular isolation portion is to form a trench by means of etching.

3. The method of manufacturing a light-emitting diode device according to claim 1, wherein said step of forming said annular isolation portion is to form a resistivity portion by means of ion implantation.

4. The method of manufacturing a light-emitting diode device according to claim 1, wherein said first GaN-based semiconductor layer is doped as a first conductivity type, said second GaN-based semiconductor layer is doped as a second conductivity type.

5. The method of manufacturing a light-emitting diode device according to claim 4, wherein said first conductivity type is an n-type and said second conductivity type is a p-type.

6. The method of manufacturing a light-emitting diode device according to claim 4, further comprising the steps of:

forming a first conductivity type confining layer on said first GaN-based semiconductor layer; and forming a second conductivity type confining layer on said active layer, wherein said step of forming said annular isolation portion is further to separate said first conductivity type confining layer into a central first conductivity type confining layer and a peripheral first conductivity type confining layer and to separate said second conductivity type confining layer into a central second conductivity type confining layer and a peripheral second conductivity type confining layer.

7. The method of manufacturing a light-emitting diode device according to claim 1, further comprising the step of:

forming an adhesion layer on the sidewalls and the bottom surface of said insulating substrate before said step of coating said conductive layer.

8. The method of manufacturing a light-emitting diode device according to claim 1, wherein said conductive layer is formed as a mirror-like reflector.

9. The method of manufacturing a light-emitting diode device according to claim 1, wherein said conductive layer is a layer selected from a group consisting of an indium-tin-oxide layer, a cadmium-tin-oxide layer, a zinc oxide layer, and a thin metal layer, with a thickness in the range from 0.001 $\mu$m to 1 $\mu$m, made of a material selected from a group consisting of Au, Ni, Pt, Al, Sn, In, Cr, Ti, and their alloy.

10. The method of manufacturing a light-emitting diode device according to claim 1, wherein said GaN-based semiconductor is a quaternary compound semiconductor of $In_xAl_yGa_{1-x-y}N$ and the mole fractions x, y satisfy $0 \leq x < 1$, $0 \leq y < 1$ and $x+y=1$.

11. A light-emitting diode device comprising:

an insulating substrate;

a laminated semiconductor structure having a first GaN-based semiconductor layer formed on the top surface of said insulating substrate; an active layer formed over said first GaN-based semiconductor layer for generating light; and a second GaN-based semiconductor layer formed over said active layer, wherein an annular isolation portion is formed to separate said second GaN-based semiconductor layer into a central second GaN-based semiconductor layer and a peripheral second GaN-based semiconductor layer and to separate said active layer into a central active layer and a peripheral active layer;

a first electrode formed on said central second GaN-based semiconductor layer without electrically connecting to said peripheral second GaN-based semiconductor layer; and a conductive layer coated to cover the sidewalls and the bottom surface of said insulating substrate and to ohmically contact with said first GaN-based semiconductor layer.

12. The light-emitting diode device according to claim 11, wherein said annular isolation portion is a trench.

13. The light-emitting diode device according to claim 11, wherein said annular isolation portion is a resistivity portion formed by an ion implantation.

14. The light-emitting diode device according to claim 11, wherein said first GaN-based semiconductor layer is doped as a first conductivity type, while said second GaN-based semiconductor layer is doped as a second conductivity type.

15. The light-emitting diode device according to claim 14, wherein said first conductivity type is an n-type and said second conductivity type is a p-type.

16. The light-emitting diode device according to claim 14, further comprising:
 a first confining layer, made of a first conductivity type GaN-based semiconductor material, formed between said first GaN-based semiconductor layer and said active layer and separated into a central first confining layer and a peripheral first confining layer by said annular isolation portion; and
 a second confining layer, made of a second conductivity type GaN-based semiconductor material, formed between said active layer and said second GaN-based semiconductor layer and separated into a central second confining layer and a peripheral second confining layer by said annular isolation portion.

17. The light-emitting diode device according to claim 11, further comprising:
 an adhesion layer sandwiched between the sidewalls and the bottom surface of said insulating substrate and said conductive layer.

18. The light-emitting diode device according to claim 11, wherein said conductive layer is formed as a mirror-like reflector.

19. The light-emitting diode device according to claim 11, wherein said conductive layer is a layer selected from a group consisting of an indium-tin-oxide layer, a cadmium-tin-oxide layer, a zinc oxide layer, and a thin metal layer, with a thickness in the range from 0.001 $\mu$m to 1 $\mu$m, made of a material selected from a group consisting of Au, Ni, Pt, Al, Sn, In, Cr, Ti, and their alloy.

20. The light-emitting diode device according to claim 11, wherein said GaN-based semiconductor is a quaternary compound semiconductor of $In_xAl_yGa_{1-x-y}N$ and the mole fractions x, y, satisfy $0 \leq x < 1$, $0 \leq y < 1$ and $x+y=1$.

* * * * *